(12) United States Patent
Kusuda

(10) Patent No.: US 7,327,947 B2
(45) Date of Patent: Feb. 5, 2008

(54) HEAT TREATING APPARATUS AND METHOD

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 101 days.

(21) Appl. No.: 11/158,985

(22) Filed: Jun. 22, 2005

(65) Prior Publication Data

US 2005/0274709 A1 Dec. 15, 2005

Related U.S. Application Data

(62) Division of application No. 10/267,127, filed on Oct. 7, 2002, now abandoned.

(30) Foreign Application Priority Data

Oct. 29, 2001 (JP) .............................. 2001-330230

(51) Int. Cl.
*A21B 2/00* (2006.01)
(52) U.S. Cl. ...................... 392/416; 392/407
(58) Field of Classification Search ..................... None
See application file for complete search history.

(56) References Cited

U.S. PATENT DOCUMENTS

| | | | |
|---|---|---|---|
| 4,567,352 A | 1/1986 | Mimura et al. | |
| 4,649,261 A | 3/1987 | Sheets | |
| 5,710,407 A | 1/1998 | Moore et al. | |
| 6,376,806 B2 | 4/2002 | Yoo | |
| 6,423,949 B1 | 7/2002 | Chen et al. | |
| 6,594,446 B2 | 7/2003 | Camm et al. | |

FOREIGN PATENT DOCUMENTS

| | | |
|---|---|---|
| JP | 57-162340 | 10/1982 |
| JP | 60-258928 | 12/1985 |
| JP | 62-26571 | 6/1987 |
| JP | 03-145123 | 6/1991 |
| JP | 9-82696 | 3/1997 |
| JP | 2001-237195 | 8/2001 |

*Primary Examiner*—Thor S. Campbell
(74) *Attorney, Agent, or Firm*—Ostrolenk, Faber, Gerb & Soffen, LLP

(57) ABSTRACT

A heat treating apparatus for heat treating a substrate by irradiating the substrate with light includes a heat treating chamber for receiving the substrate, a heating plate for preheating the substrate through a thermal diffuser plate, xenon flashlamps for heating the substrate preheated by the heating plate, to a treating temperature by irradiating the substrate with flashes of light, and a decompression mechanism for decompressing the heat treating chamber when the xenon flashlamps heat the substrate.

11 Claims, 6 Drawing Sheets

HEAT TREATING APPARATUS AND METHOD

CROSS REFERENCE TO A RELATED APPLICATION

The present application is a Divisional Application of Ser. No. 10/267,127 filed Oct. 7, 2002, now abandoned which application claims the benefit and priority of Japanese Application Serial No. 2001-330230 filed Oct. 29, 2001, incorporated by reference.

BACKGROUND OF THE INVENTION

1. Field of the Invention

The present invention relates to a heat treating apparatus and method for heat treating substrates such as semiconductor wafers by irradiating the substrates with light.

2. Description of the Related Art

A heat treating apparatus such as a lamp annealing apparatus with halogen lamps is used to execute a step of activating ions implanted in a semiconductor wafer. Such a heat treating apparatus activates ions in the semiconductor wafer by heating the wafer to a temperature of about 1,000 to 1,100 deg C., for example. Then, the heat treating apparatus heats the wafer at a rate of some several hundred degrees per second by using the energy of light emitted from the halogen lamps.

However, it has been found that, even when ions in the semiconductor wafer are activated by using the heat treating apparatus that heats the wafer at the rate of several hundred degrees per second, the ions implanted in the semiconductor wafer present a blunt profile, that is the ions become dispersed. When such a phenomenon occurs, the ions become dispersed even though implanted in high concentration into the surface of the semiconductor wafer, and hence a problem of having to implant the ions in a larger amount than is necessary.

To solve the above problem, it is conceivable to use xenon flashlamps, for example, to irradiate the surface of the semiconductor wafer with flashes, thereby to heat, within an extremely short time, only the surface of the semiconductor wafer implanted with ions. However, although the surface of the semiconductor wafer may be heated very quickly by using xenon flashlamps, the wafer is heated only to 500 degrees or thereabouts. It is impossible to heat the semiconductor wafer to the temperature of about 1,000 to 1,100 deg C. necessary for activating the ions in the wafer.

On the other hand, Japanese Patent Publication (Unexamined) No. 2001-237195, by way of addressing the above problem, discloses a heat treating apparatus having a preheating device for preheating a substrate before heating the substrate by xenon flashlamps.

With such a heat treating apparatus, flashes from the xenon flashlamps may cause a reaction of the gas in the heat treating chamber storing the semiconductor wafer. Where, for example, oxygen is present in the gas, ozone is momentarily generated from the oxygen to lower the pressure in the heat treating chamber in an instant. Such a sudden pressure drop produces a relatively loud sound, i.e. vibration. This vibration scatters particles in the heat treating chamber, and hence a problem of the particles adhering to the semiconductor wafer under heat treatment. In an extreme case, the vibration could move the semiconductor wafer.

The gas in the heat treating chamber circulates therein by convection. It is therefore difficult to heat the surface of the semiconductor wafer uniformly in time of preheating by the preheating device or flash heating by the xenon flashlamps.

Further, the above heat treating apparatus has numerous materials for sealing the heat treating chamber or maintaining the chamber at a high temperature. Where oxygen is present in the heat treating chamber, these materials are oxidized in time of flash heating by the xenon flashlamps, thereby shortening the service life of the heat treating chamber. Where the gas in the heat treating chamber contains organic substances, these substances become melanized and adhere to a translucent plate forming the heat treating chamber, to reduce the life of the heat treating chamber.

SUMMARY OF THE INVENTION

The object of the present invention, therefore, is to provide a heat treating apparatus and method for treating semiconductor wafers uniformly and cleanly without reducing the life of the apparatus.

The above object is fulfilled, according to the present invention, by a heat treating apparatus for heat treating a substrate by irradiating the substrate with light, comprising a heat treating chamber for receiving the substrate, an assist heating device for preheating the substrate, a flash heating device for heating the substrate preheated by the assist heating device, to a treating temperature by irradiating the substrate with flashes of light, and a decompression device for decompressing the heat treating chamber when the flash heating device heats the substrate.

This heat treating apparatus is free from a reaction of the gas in the heat treating chamber which could scatter particles and move the substrate. By decompressing the heat treating chamber, no convection occurs in the heat treating chamber. Consequently, the surface of the substrate may be heated uniformly. Further, the decompression of the heat treating chamber is effective to avoid a reduction in the life of the heat treating apparatus due to oxidation of the materials forming the heat treating chamber or melanization of organic substances.

In another aspect of the invention, there is provided a heat treating method for heat treating a substrate by irradiating the substrate with light. This method comprises a substrate loading step for loading the substrate into a heat treating chamber, a preheating step for preheating the substrate loaded into the heat treating chamber, a decompressing step for decompressing the heat treating chamber, a flash heating step for heating the substrate to a treating temperature by irradiating the substrate with flashes of light after the substrate in the heat treating chamber is preheated to a predetermined preheat temperature, an opening step for opening the heat treating chamber to atmosphere, and a substrate unloading step for unloading the substrate from the heat treating chamber.

Preferably, the flash heating step is executed to heat the substrate to the treating temperature by irradiating the substrate with flashes of light immediately after the substrate in the heat treating chamber is preheated to the predetermined preheat temperature. With this method, even when the heat treating chamber is in a decompressed state, the flash heating step may be executed for the substrate having reached the preheat temperature.

Other features and advantages of the present invention will be apparent from the following detailed description of the embodiment of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Figure 1:
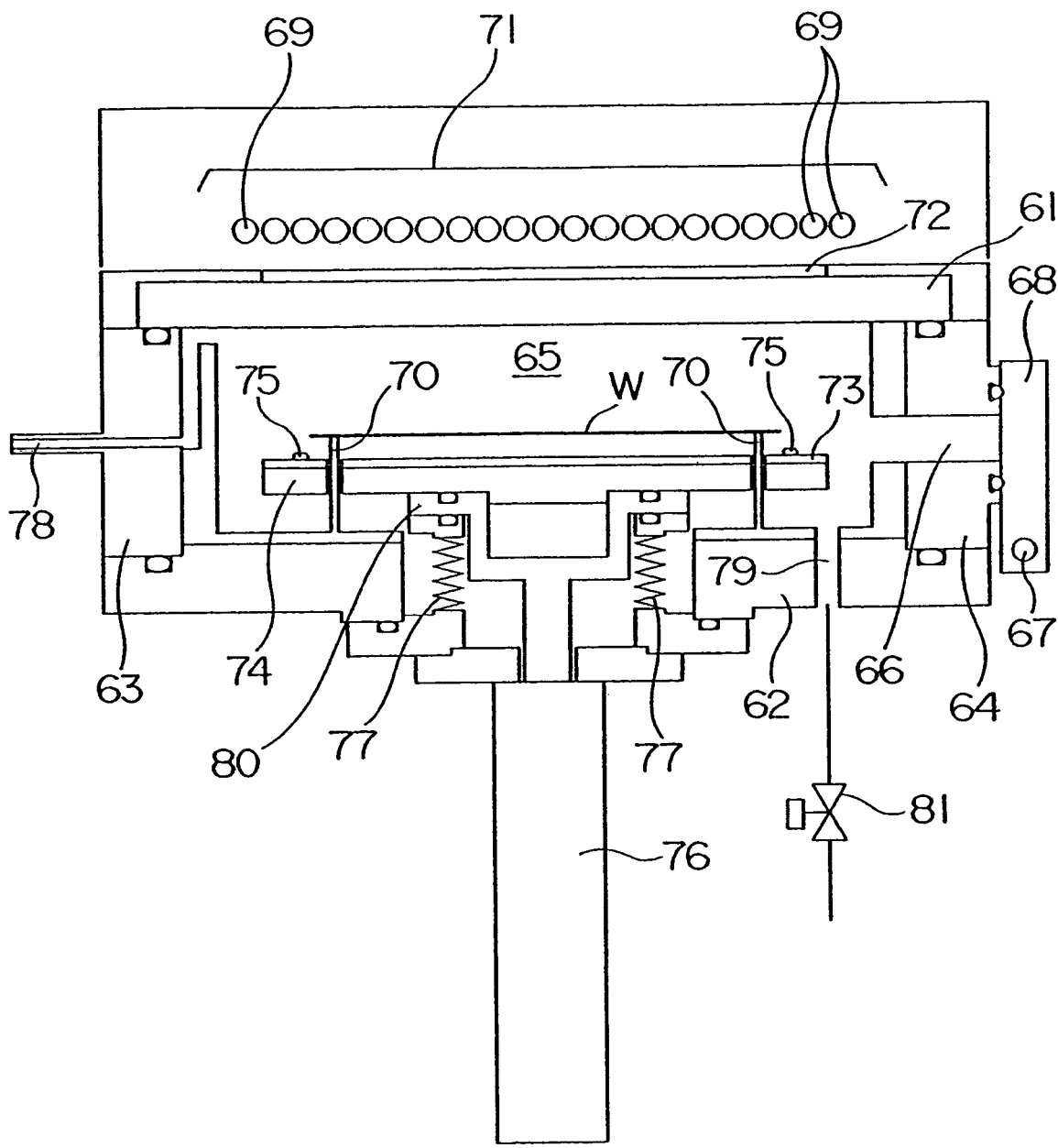
FIG. 1 is a sectional side view of a heat treating apparatus according to the invention.
Figure 2:
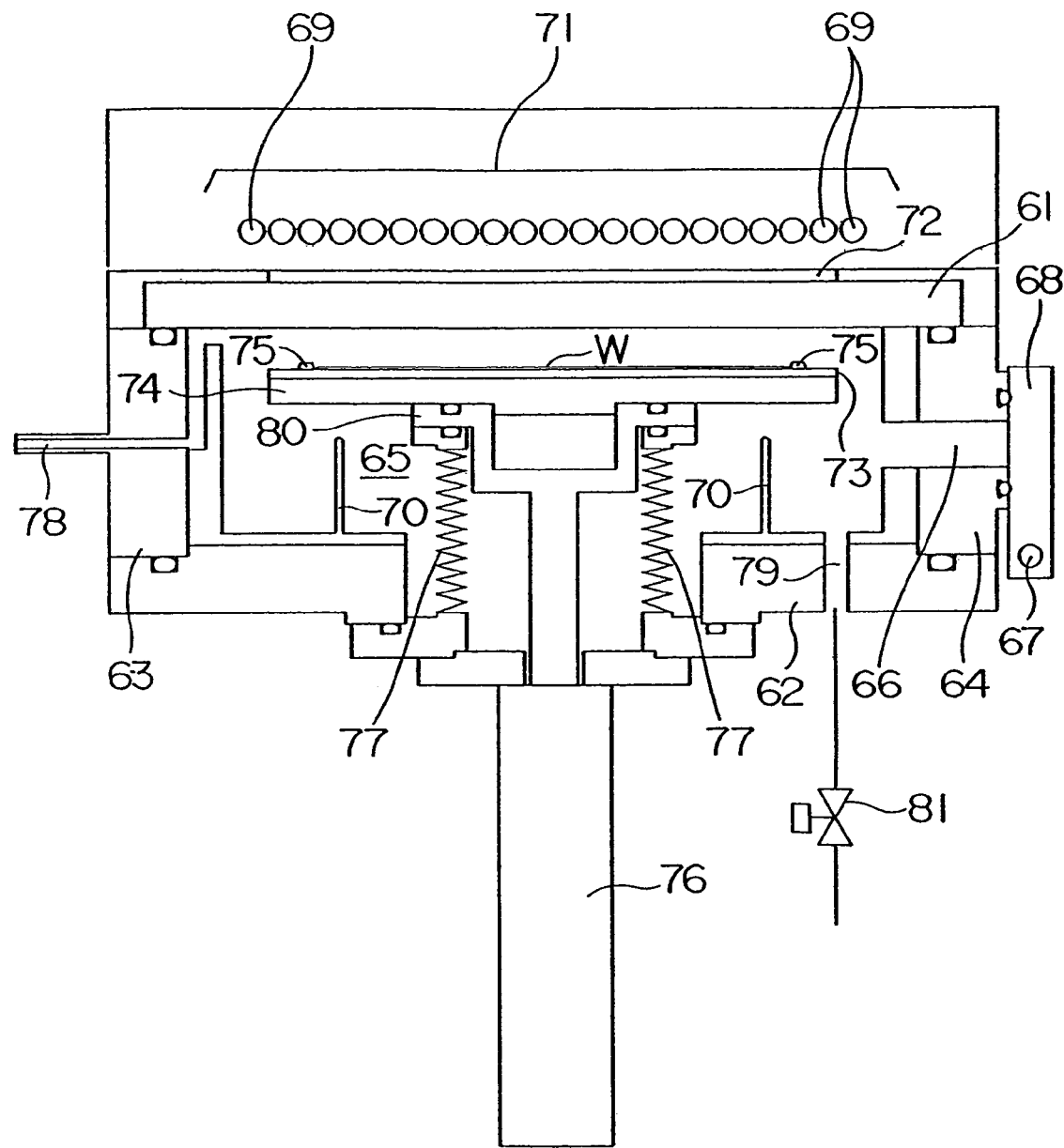
FIG. 2 is a sectional side view of the heat treating apparatus.
Figure 3:
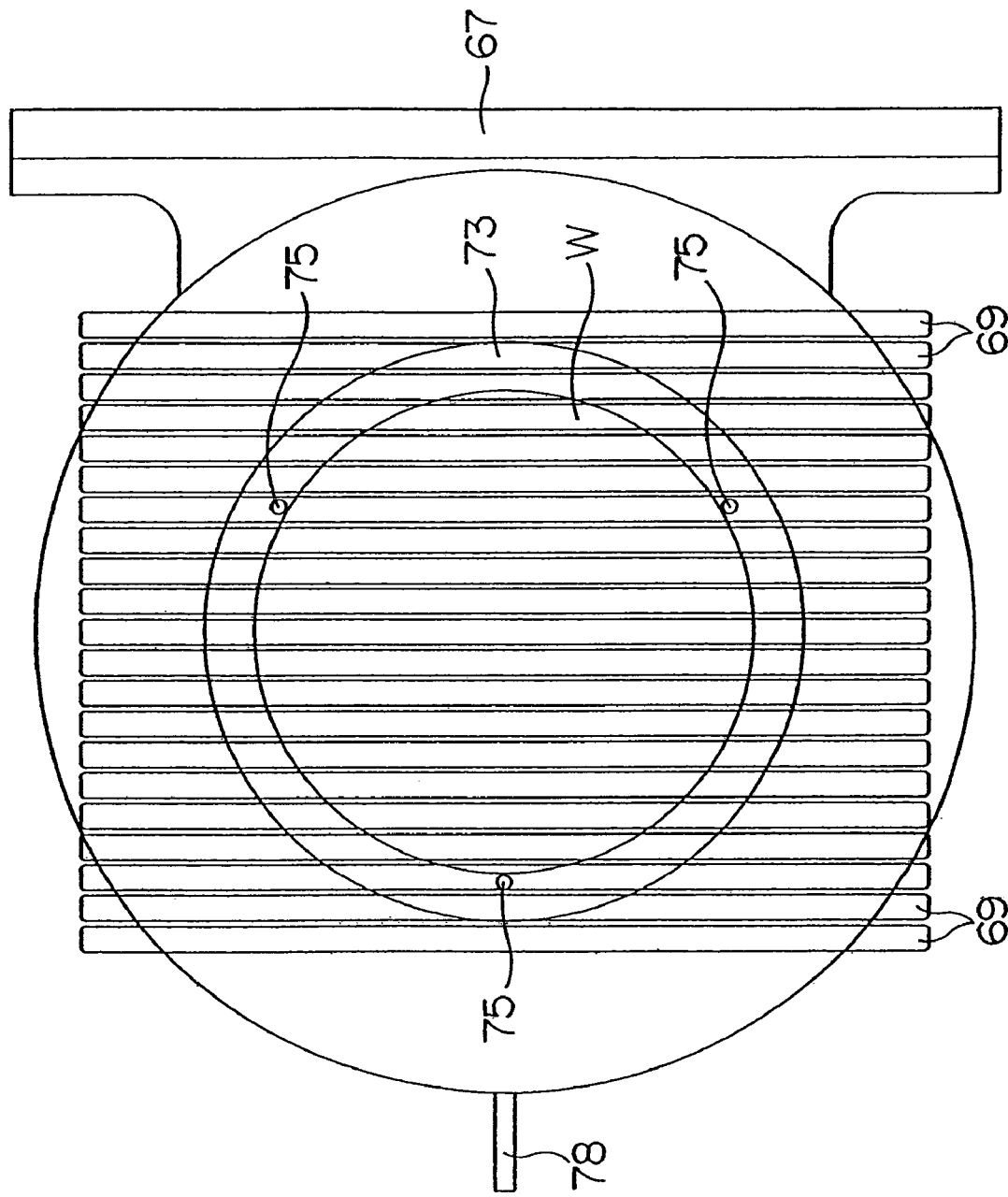
FIG. 3 is a schematic plan view of the heat treating apparatus.

An embodiment of the present invention will be described hereinafter with reference to the drawings. FIGS. 1 and 2 are sectional side views of a heat treating apparatus according to the invention. FIG. 3 is a schematic plan view of the apparatus.

This heat treating apparatus includes a heat treating chamber 65 having a translucent plate 61, a bottom plate 62 and a pair of side plates 63 and 64 for receiving and heat treating a semiconductor wafer W. The translucent plate 61 acting as part of the heat treating chamber 65 is formed of an infrared transmitting material such as quartz. The bottom plate 62 acting as part of the heat treating chamber 65 has support pins 70 erected thereon and extending through a thermal diffuser plate 73 and a heating plate 74 to be described hereinafter, for supporting the semiconductor wafer W at the lower surface thereof.

The side plate 64 acting as part of the heat treating chamber 65 defines an opening 66 for loading and unloading the semiconductor wafer W. The opening 66 is closable by a gate valve 68 pivotable about an axis 67. With the opening 66 opened, the semiconductor wafer W is loaded into the heat treating chamber 65 by a transport robot not shown.

A plurality of (21 in this embodiment) cylindrical xenon flashlamps 69 are arranged parallel to one another above the heat treating chamber 65. A reflector 71 is disposed above the xenon flashlamps 69.

Each xenon flashlamp 69 includes a glass tube filled with xenon gas and having an anode and a cathode disposed at opposite ends thereof and connected to a capacitor, and a trigger electrode wound around the glass tube. Since xenon gas is an electrical insulator, electricity does not flow through the glass tube in a normal state. However, when the insulation is broken by applying a high voltage to the trigger electrode, electricity stored in the capacitor flows through the glass tube. This generates Joule heat which heats the xenon gas, thereby emitting light. In the xenon flashlamps 69, electrostatic energy stored is converted into extremely short light pulses of 0.1 to 10 milliseconds. Thus, the xenon flashlamps 69 are characterized by their capability of emitting extremely strong light compared with continuously lit light sources.

A light diffuser plate 72 is disposed between the xenon flashlamps 69 and translucent plate 61. The light diffuser plate 72 is formed of quartz glass which is an infrared transmitting material with surfaces thereof given light diffusion treatment.

The heat treating chamber 65 has the thermal diffuser plate 73 and heating plate 74 arranged in the stated order therein. The thermal diffuser plate 73 has pins 75 provided on the upper surface thereof for holding the semiconductor wafer W against displacement.

The heating plate 74 is provided for preheating the semiconductor wafer W. This heating plate 74 is formed of white aluminum nitride. The heating plate 74 contains a heater and a sensor for controlling the heater. The heating plate 74 need not be formed entirely of white aluminum nitride, but only the surface thereof opposed to the thermal diffuser plate 73 may be formed of white aluminum nitride.

With white aluminum nitride used for forming the surface of the heating plate 74 opposed to the thermal diffuser plate 73 as noted above, the heating plate 74 is prevented from burning in time of flash exposure described hereinafter. However, the heating plate 74 may be formed of non-white aluminum nitride or silicon carbide (SiC).

The thermal diffuser plate 73 is provided for diffusing thermal energy from the heating plate 74 to heat the semiconductor wafer W uniformly. The thermal diffuser plate 73 is formed of a material having a smaller coefficient of thermal conductivity than the heating plate 74.

Specifically, the thermal diffuser plate 73 may be formed of quartz which has a moderate coefficient of thermal conductivity and which never contaminates the semiconductor wafer W. Instead of quartz, sapphire which is an aluminum oxide may be used.

Figure 4:
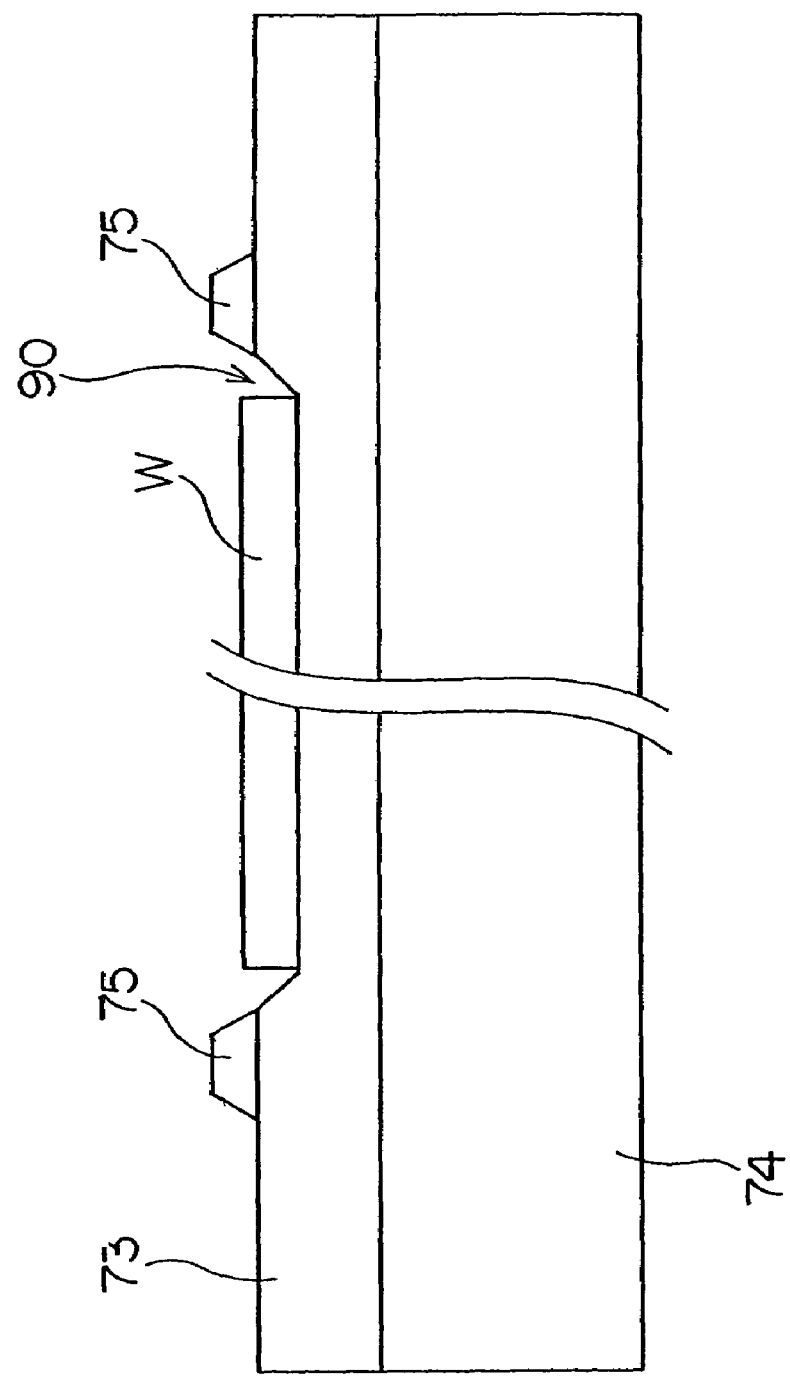
FIG. 4 is an enlarged side view of a portion of a thermal diffuser plate.

FIG. 4 is an enlarged side view of a portion of the thermal diffuser plate 73.

As shown in FIG. 4, the thermal diffuser plate 73 has a recess 90 formed in the surface thereof to have a shape corresponding to the outside diameter of semiconductor wafer W. The recess 90 has a depth substantially corresponding to the thickness of wafer W, and this depth is not depicted in FIGS. 1 through 3. The wafer W is positioned in the recess 90 and held against displacement by the positioning pins 75 noted hereinbefore. The recess 90 and positioning pins 75 constitute a positioning device for the wafer W. It is possible to omit either the recess 90 or positioning pins 75.

Referring again to FIGS. 1 through 3, the thermal diffuser plate 73 and heating plate 74 are driven by an air cylinder 76 to move vertically between a position shown in FIG. 1 for loading and unloading the semiconductor wafer W, and a position shown in FIG. 2 for heat treating the wafer W.

The thermal diffuser plate 73 and heating plate 74 are lowered to the position shown in FIG. 1 for loading and unloading the semiconductor wafer W. In this position, the transport robot not shown is used to carry the semiconductor wafer W in through the opening 66 and place the wafer W on the support pins 70, or to remove the wafer W from the support pins 70 and carry the wafer W out through the opening 66. In this state, upper ends of the support pins 70 extend through bores formed in the thermal diffuser plate 73 and heating plate 74, and project upward from the surface of thermal diffuser plate 73. For expediency of description, FIG. 1 shows the bores in the thermal diffuser plate 73 and heating plate 74 which actually are invisible in side view.

The thermal diffuser plate 73 and heating plate 74 are raised to the position shown in FIG. 2, in which the two plates 73 and 74 are above the upper ends of support pins 70, for heat treating the semiconductor wafer W. In this state, the semiconductor wafer W is raised, with the lower surface thereof supported by the upper surface of thermal diffuser plate 73, to the position close to the translucent plate 61.

Particles may be generated when the thermal diffuser plate 73 and heating plate 74 are moved up and down between the loading and unloading position and the heat treating position. In order to prevent such particles from adhering to the semiconductor wafer W, a bellows 77 is disposed to extend between a support member 80 supporting the heating plate 74 and the bottom plate 62 of heat treating chamber 65.

An intake passage 78 is formed in the side wall 63 remote from the opening 66 of the heat treating chamber 65. This intake passage 78 is provided to introduce air in time of opening the chamber 65 to the atmosphere to be described hereinafter. Instead of air, nitrogen gas or other gas may be introduced.

The bottom plate 62 of heat treating chamber 65 defines an exhaust port 79. This exhaust port 79 is connected to a decompression mechanism such as a vacuum pump through a switch valve 81. The exhaust port 79 and switch valve 81 constitute the decompression device of the present invention.

Figure 5:
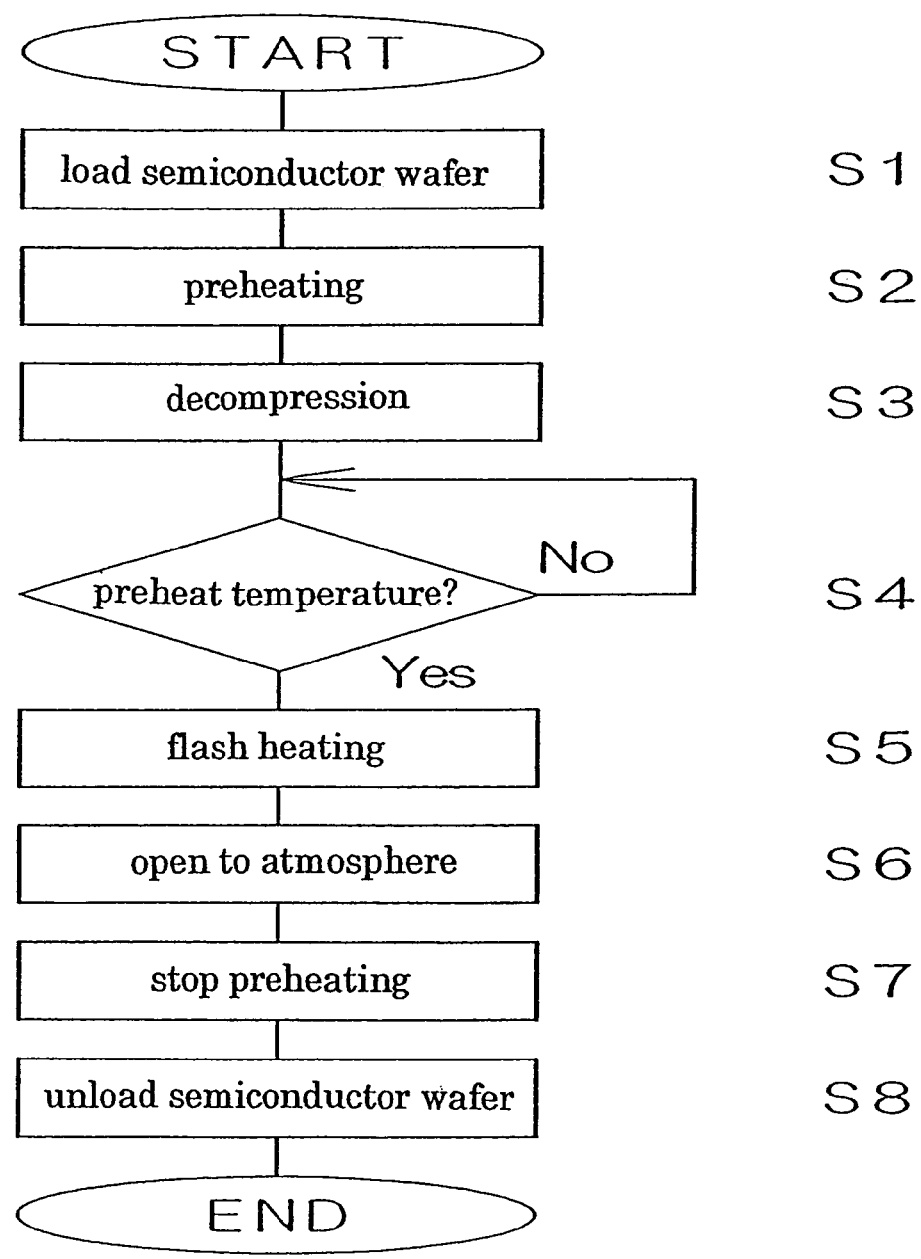
FIG. 5 is a flow chart showing a semiconductor wafer heat treating operation of the heat treating apparatus according to the invention.
Figure 6:
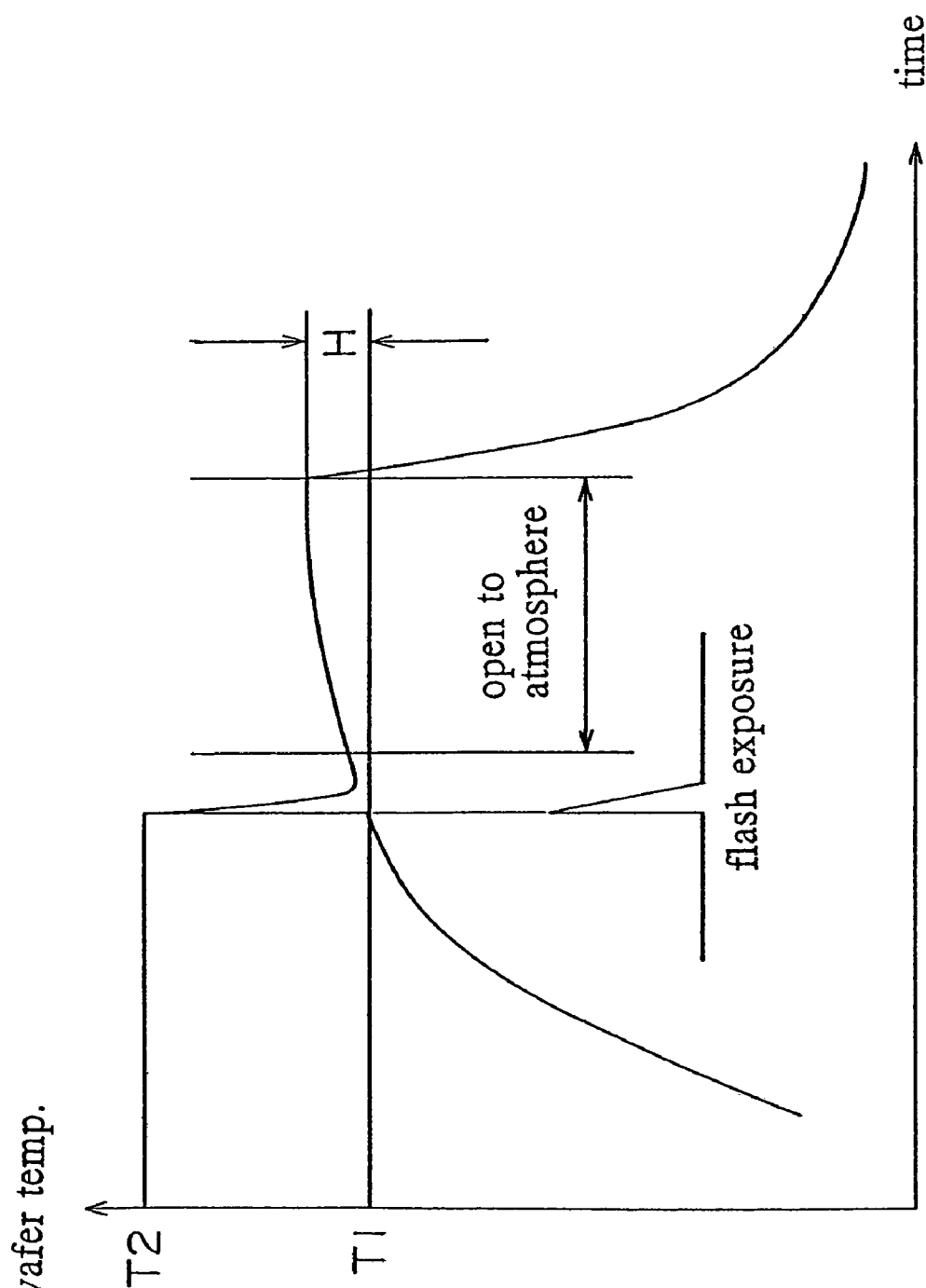
FIG. 6 is a graph showing changes in the temperature of the semiconductor wafer.

An operation of the heat treating apparatus for heat treating the semiconductor wafer W according to the invention will be described next. FIG. 5 is a flow chart showing the operation for heat treating the semiconductor wafer W by the heat treating apparatus according to the invention. FIG. 6 is a graph showing changes in the temperature of the semiconductor wafer W.

In this heat treating apparatus, with the thermal diffuser plate 73 and heating plate 74 lowered to the position shown in FIG. 1 for loading and unloading the semiconductor wafer W, the transport robot not shown carries the semiconductor wafer W in through the opening 66 and places the wafer W on the support pins 70. Upon completion of the wafer loading operation, the opening 66 is closed by the gate valve 68 (step S1). Subsequently, the thermal diffuser plate 73 and heating plate 74 are raised by the air cylinder 76 to the position shown in FIG. 2 for heat treating the semiconductor wafer W.

The thermal diffuser plate 73 and heating plate 74 have been heated by the heater mounted in the heating plate 74. Thus, with the thermal diffuser plate 73 and heating plate 74 raised to the heat treating position shown in FIG. 2, the semiconductor wafer W is preheated by through contact with the hot thermal diffuser plate 73. The temperature of wafer W gradually increases as shown in FIG. 6 (step S2).

In this preheating step, the wafer W receives thermal energy from the heating plate 74 through the thermal diffuser plate 73. Consequently, the wafer W may be heated uniformly even when the heating plate 74 has a temperature distribution not entirely uniform.

In parallel with the preheating step, the heat treating chamber 65 is decompressed (step S3). That is, the switch valve 81 is opened to connect the intake passage 78 to the decompression mechanism not shown, thereby purging and decompressing the heat treating chamber 65. Preferably, the heat treating chamber 65 is decompressed to 1/10 to 1/100 atmospheric pressure to produce various advantageous effects to be described hereinafter.

In this state, the semiconductor wafer W continues to be heated through the thermal diffuser plate 73. In time of temperature increase, the surface temperature of semiconductor wafer W is constantly monitored by a temperature sensor not shown, to determine whether the surface has reached a preheat temperature T1 (step S4).

The preheat temperature T1 is in a range of about 200 to 600 deg C. Even if the semiconductor wafer W is heated to such preheat temperature T1, the ions implanted in the wafer W remain unchanged, i.e. are never dispersed.

Immediately after the surface temperature of semiconductor wafer W reaches the preheat temperature T1 in FIG. 6, the xenon flashlamps 69 are lit for flash heating (step S5). The lighting time of the xenon flashlamps 69 in this flash heating step is about 0.1 to 10 milliseconds. In this way, the electrostatic energy prestored in the xenon flashlamps 69 is converted into such an extremely short light pulse. This results in very strong flashes being emitted.

In this state, the surface temperature of semiconductor wafer W reaches temperature T2 in FIG. 6. This temperature T2 is about 1,000 to 1,100 deg C., i.e. a temperature necessary for treating the semiconductor wafer W. When the surface of semiconductor wafer W is heated to this treating temperature T2, the ions in the wafer W are activated.

The surface of semiconductor wafer W is heated to the treating temperature T2 in the extremely short time of about 0.1 to 10 milliseconds. Consequently, the activation of the ions in the semiconductor wafer W is completed in a short time. This prevents the ions implanted in the semiconductor wafer W from becoming dispersed to present a blunt profile.

As noted above, before lighting the xenon flashlamps 69 to heat the semiconductor wafer W, the heating plate 74 is used to raise the surface temperature of semiconductor wafer W to the preheat temperature T1 of about 200 to 600 deg C. The semiconductor wafer W may therefore be heated by the xenon flashlamps 21 quickly to the treating temperature T2 of about 1,000 to 1,100 deg C.

In this flash heating step, the heating plate 74 is subjected to rays transmitted through the thermal diffuser plate 73 formed of quartz. However, the heating plate 74 formed of white aluminum nitride is never burnt.

The above flash heating step is executed under the decompressed condition. This step therefore is executed free from a reaction of the gas in the heat treating chamber 65 which could scatter particles and move the semiconductor wafer W, as in the prior art.

Similarly, by decompressing the heat treating chamber 65, no convection occurs in the heat treating chamber. Consequently, the surface of semiconductor wafer W may be heated uniformly in the preheating step and flash heating step.

Further, by decompressing the heat treating chamber 65, oxygen and organic substances may be excluded from the heat treating chamber 65. This avoids a reduction in the life of the heat treating apparatus due to oxidation of the materials forming the heat treating chamber 65 or melanization of organic substances.

After the flash heating step, the switch valve 81 is closed and air is introduced through the intake passage 78 to open the heat treating chamber 65 to the atmosphere (step S6). The semiconductor wafer W stops being heated by the heating plate 74 (step S7).

As noted above, flash heating is carried out immediately after the surface temperature of semiconductor wafer W reaches the preheat temperature T1. Upon completion of the flash heating step, the heat treating chamber 65 is opened to the atmosphere. These steps are taken for the following reason.

In the heat treating apparatus according to the invention, the heating plate 74 is installed in the decompressed heat treating chamber 65. It is therefore difficult to cool the heating plate 74 and to maintain the heating plate 74 at a desired temperature. Where this problem is addressed by using a cooling device such as Peltier elements, the semiconductor wafer W will have reduced temperature uniformity.

The heat treating apparatus according to the invention, therefore, carries out flash heating immediately after the surface temperature of semiconductor wafer W reaches the preheat temperature T1, avoiding the flash heating being carried out when the semiconductor wafer W becomes heated above the preheat temperature T1. After the flash heating step, the heat treating chamber 65 is opened to the atmosphere to cool its interior. Consequently, as shown in FIG. 6, the temperature of semiconductor wafer W lowers quickly after slightly overshooting (as at H) the preheat temperature T1.

After completion of the opening to the atmosphere of the heat treating chamber 65, the air cylinder 76 lowers the thermal diffuser plate 73 and heating plate 74 to the position shown in FIG. 1 for loading and unloading the semiconductor wafer W. The opening 66 that has been closed by the gate valve 68 is opened. The transport robot not shown removes the semiconductor wafer W resting on the support pins 70 and carries the wafer W out of the apparatus (step S8).

The above embodiment uses the heating plate 74 as the preheating device. Instead, lamps such as halogen lamps may be used as the preheating device.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2001-330230 filed in the Japanese Patent Office on Oct. 29, 2001, the entire disclosure of which is incorporated herein by reference.

What is claimed is:

1. A heat treating method for heat treating a substrate by irradiating the substrate with light, comprising:
    a first assist heating means positioning step for positioning assist heating means for loading and unloading the substrate;
    a substrate loading step for loading the substrate into a heat treating chamber;
    a second assist heating means positioning step for positioning the assist heating means for heat treating the substrate;
    a preheating step for preheating the substrate loaded into said heat treating chamber;
    a flash heating step for heating the substrate to a treating temperature by irradiating the substrate with flashes of light after the substrate in said heat treating chamber is preheated to a predetermined preheat temperature;
    wherein the flash heating step is carried out immediately after a surface temperature of the substrate reaches the preheat temperature,
    a decompressing step for decompressing said heat treating chamber to $1/10$ to $1/1000$ atmospheric pressure during the preheating step and the flash heating step;
    upon completion of the flash heating step, the heat treating chamber is opened to the atmosphere;
    a third assist heating means positioning step for positioning the assist heating means for loading and unloading the substrate after the substrate is heated in the flash heating step;
    a substrate unloading step for unloading the substrate from said heat treating chamber.

2. A heat treating method as defined in claim 1, wherein said flash heating step is executed to heat the substrate to the treating temperature by irradiating the substrate with flashes of light immediately after the substrate in said heat treating chamber is preheated to the predetermined preheat temperature.

3. A heat treating method as defined in claim 2, wherein said preheating step is executed to preheat the substrate to 200 to 600 degrees centigrade.

4. A heat treating method as defined in claim 2, wherein said flash heating step is executed to heat the substrate to 1,000 to 1,100 degrees centigrade.

5. A heat treating method as defined in claim 2, wherein said flash heating step is executed to heat the substrate to the treating temperature in 0.1 to 10 milliseconds.

6. A heat treating method for heat treating a substrate by irradiating the substrate with light, comprising:
    a first assist heating means positioning step for positioning assist heating means for loading and unloading the substrate;
    a substrate loading step for loading the substrate into a heat treating chamber;
    a second assist heating means positioning step for positioning the assist heating means for heat treating the substrate;
    a preheating step for preheating the substrate loaded into said heat treating chamber;
    a flash heating step for heating the substrate to a treating temperature by irradiating the substrate with flashes of light after the substrate in said heat treating chamber is preheated to a predetermined preheat temperature,
    wherein flash heating is carried out immediately after the surface temperature of the substrate reaches the preheat temperature,
    upon completion of the flash heating step, the heat treating chamber is opened to the atmosphere;
    a decompressing step for decompressing said heat treating chamber during the preheating step and the flash heating step;
    a third assist heating means positioning step for positioning the assist heating means for loading and unloading the substrate after the substrate is heated in the flash heating step;
    a substrate unloading step for unloading the substrate from said heat treating chamber.

7. A heat treating method as defined in claim 6, wherein said flash heating step is executed to heat the substrate to the treating temperature by irradiating the substrate with flashes of light immediately after the substrate in said heat treating chamber is preheated to the predetermined preheat temperature.

8. A heat treating method as defined in claim 7, wherein said decompressing step is executed to decompress said heat treating chamber to $1/10$ to $1/1000$ atmospheric pressure.

9. A heat treating method as defined in claim 8, wherein said preheating step is executed to preheat the substrate to 200 to 600 degrees centigrade.

10. A heat treating method as defined in claim 8, wherein said flash heating step is executed to heat the substrate to 1,000 to 1,100 degrees centigrade.

11. A heat treating method as defined in claim 8, wherein said flash heating step is executed to heat the substrate to the treating temperature in 0.1 to 10 milliseconds.

* * * * *